(12) United States Patent
White et al.

(10) Patent No.: US 6,193,507 B1
(45) Date of Patent: Feb. 27, 2001

(54) MULTI-FUNCTION CHAMBER FOR A SUBSTRATE PROCESSING SYSTEM

(75) Inventors: John M. White, Hayward; Wendell T. Blonigan, Union City; Michael W. Richter, Sunnyvale, all of CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/502,117

(22) Filed: Feb. 10, 2000

Related U.S. Application Data

(62) Division of application No. 09/082,375, filed on May 20, 1998.

(51) Int. Cl.[7] .................................................. F27D 3/06
(52) U.S. Cl. .................... 432/247; 432/184; 414/222; 118/724; 118/725
(58) Field of Search .................... 432/4, 18, 129, 432/184, 243, 247; 414/217, 222, 225; 118/719, 724, 725, 728; 219/209, 390

(56) References Cited

U.S. PATENT DOCUMENTS

| | | |
|---|---|---|
| 4,047,624 | 9/1977 | Dorenbos . |
| 4,709,655 | 12/1987 | Van Mastrigt . |
| 4,775,281 | 10/1988 | Prentakis . |
| 4,846,102 | 7/1989 | Ozias . |
| 4,857,689 | 8/1989 | Lee . |
| 4,870,923 | 10/1989 | Sugimoto . |
| 4,895,107 | 1/1990 | Yano et al. . |
| 4,913,929 | 4/1990 | Moslehi et al. . |
| 4,951,601 | 8/1990 | Maydan et al. . |
| 4,989,543 | 2/1991 | Schmitt . |
| 5,001,327 | 3/1991 | Hirasawa et al. . |
| 5,060,354 | 10/1991 | Chizinsky . |
| 5,187,115 | 2/1993 | Coleman . |
| 5,227,708 | 7/1993 | Lowrance . |
| 5,252,807 | 10/1993 | Chizinsky . |
| 5,259,883 | 11/1993 | Yamabe et al. . |
| 5,288,379 | 2/1994 | Namiki et al. . |
| 5,352,294 | 10/1994 | White et al. . |
| 5,355,066 | 10/1994 | Lowrance . |

(List continued on next page.)

FOREIGN PATENT DOCUMENTS

| | | |
|---|---|---|
| 2114470 | 9/1972 | (DE) . |
| 3941110 A1 | 6/1990 | (DE) . |
| 0608620A1 | 8/1994 | (EP) . |
| 0608633A2 | 8/1994 | (EP) . |
| 0756316A1 | 1/1997 | (EP) . |
| 63-141342 | 6/1988 | (JP) . |
| 3-136345 | 6/1991 | (JP) . |
| WO 92/17621 | 10/1992 | (WO) . |
| WO 92/21144 | 11/1992 | (WO) . |
| WO 94/14185 | 6/1994 | (WO) . |

*Primary Examiner*—Denise L. Ferensic
*Assistant Examiner*—Gregory A. Wilson
(74) *Attorney, Agent, or Firm*—Thomason, Moser & Patterson, LLP

(57) ABSTRACT

A load lock chamber includes a chamber body having an aperture to allow a substrate to be transferred into or out of the chamber. The load lock chamber is configurable in several configurations, including a base configuration for providing a transition between two different pressures, a heating configuration for heating the substrate and providing a transition between two different pressures, and a cooling configuration for cooling the substrate and providing a transition between two different pressures. Various features of the chamber configurations help increase the throughput of the system by enabling rapid heating and cooling of substrates and simultaneous evacuation and venting of the chamber, and help compensate for thermal losses near the substrate edges, thereby providing a more uniform temperature across the substrate.

12 Claims, 7 Drawing Sheets

U.S. PATENT DOCUMENTS

| | | |
|---|---|---|
| 5,447,409 | 9/1995 | Grunes et al. . |
| 5,469,035 | 11/1995 | Lowrance . |
| 5,470,784 | 11/1995 | Coleman . |
| 5,474,410 | 12/1995 | Ozawa et al. . |
| 5,512,320 | 4/1996 | Turner et al. . |
| 5,588,827 | 12/1996 | Muka . |
| 5,607,009 | 3/1997 | Turner et al. . |
| 5,609,689 | 3/1997 | Kato et al. . |
| 5,611,865 | 3/1997 | White et al. . |
| 5,674,786 | 10/1997 | Turner et al. . |
| 5,716,207 | 2/1998 | Mishina et al. . |
| 5,891,251 | 4/1999 | MacLeish et al. . |

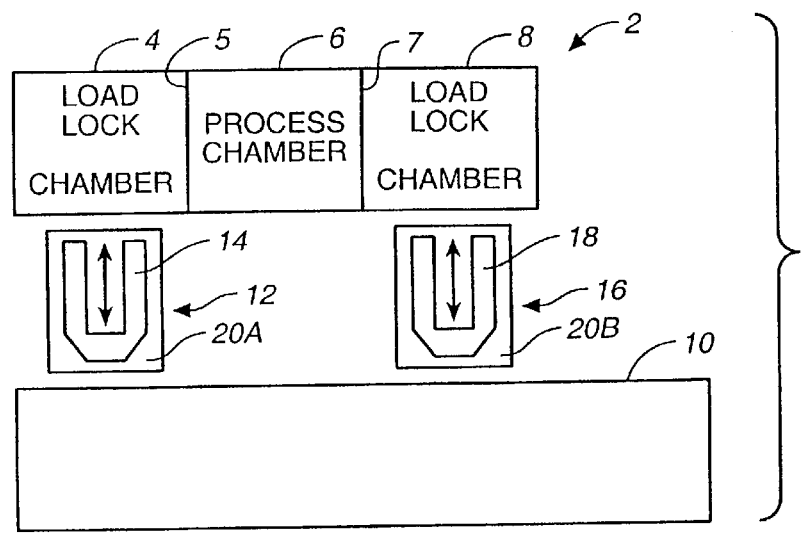
*FIG._1*
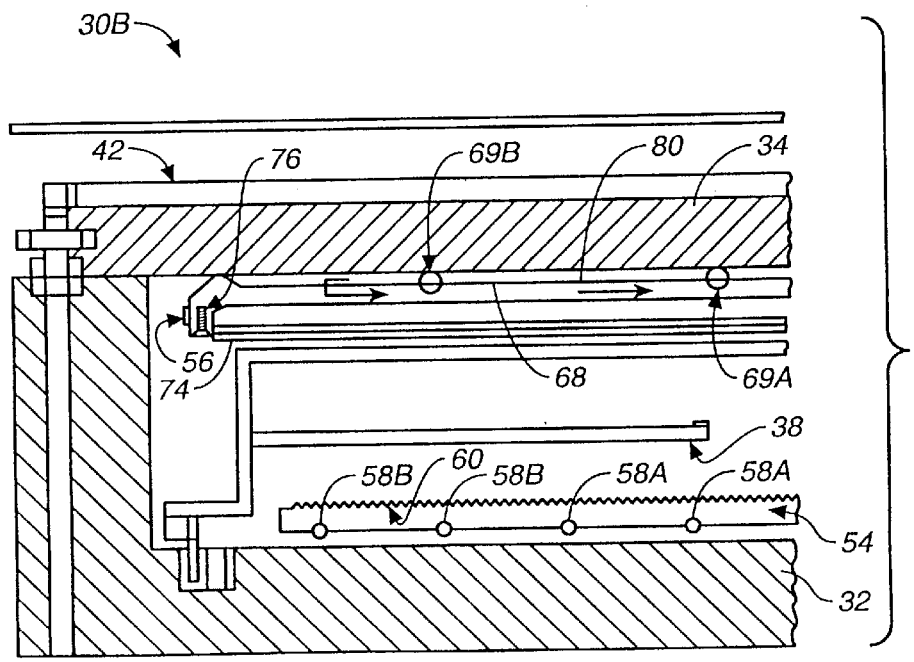
*FIG._5*

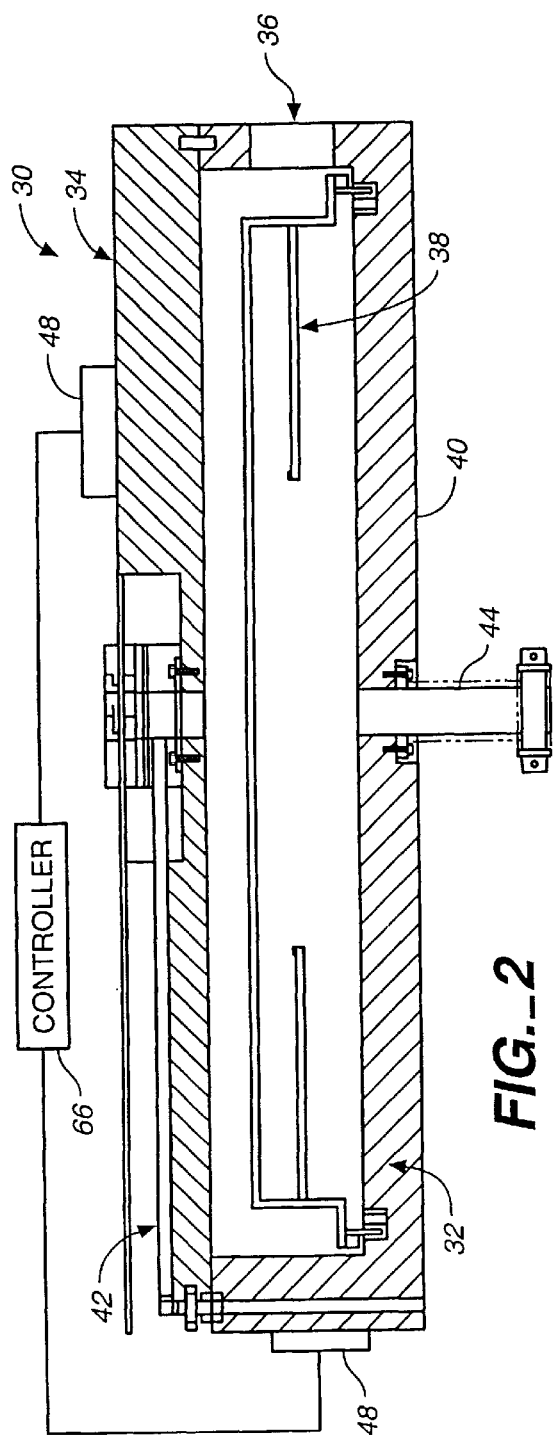
FIG._2
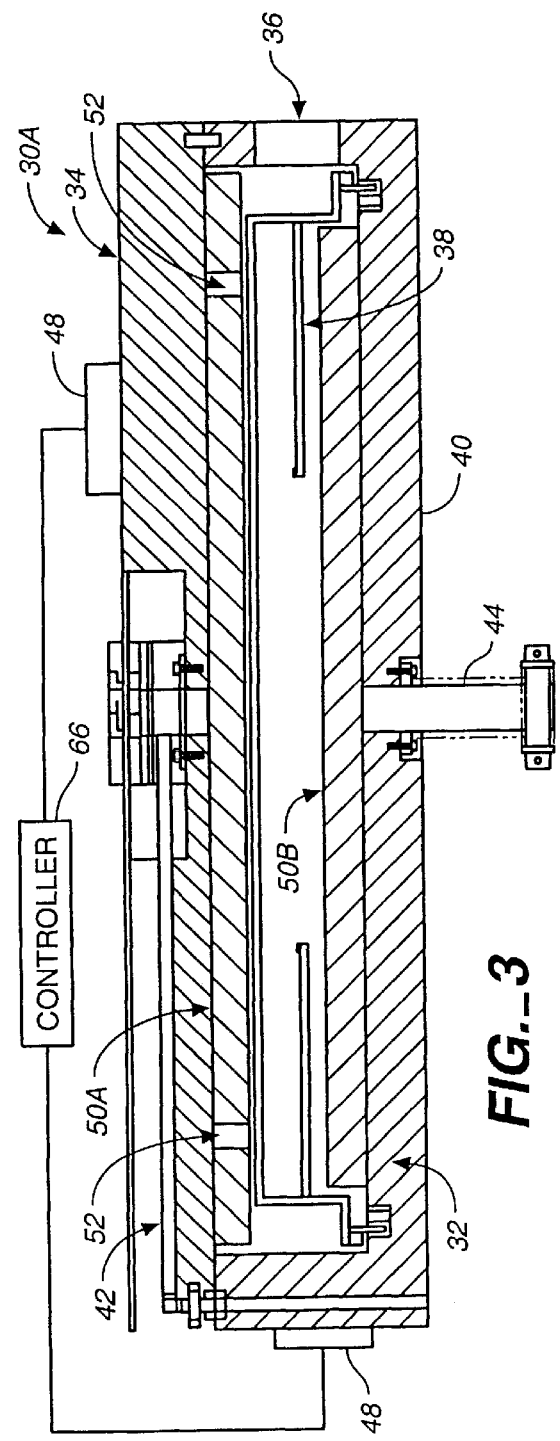
FIG._3

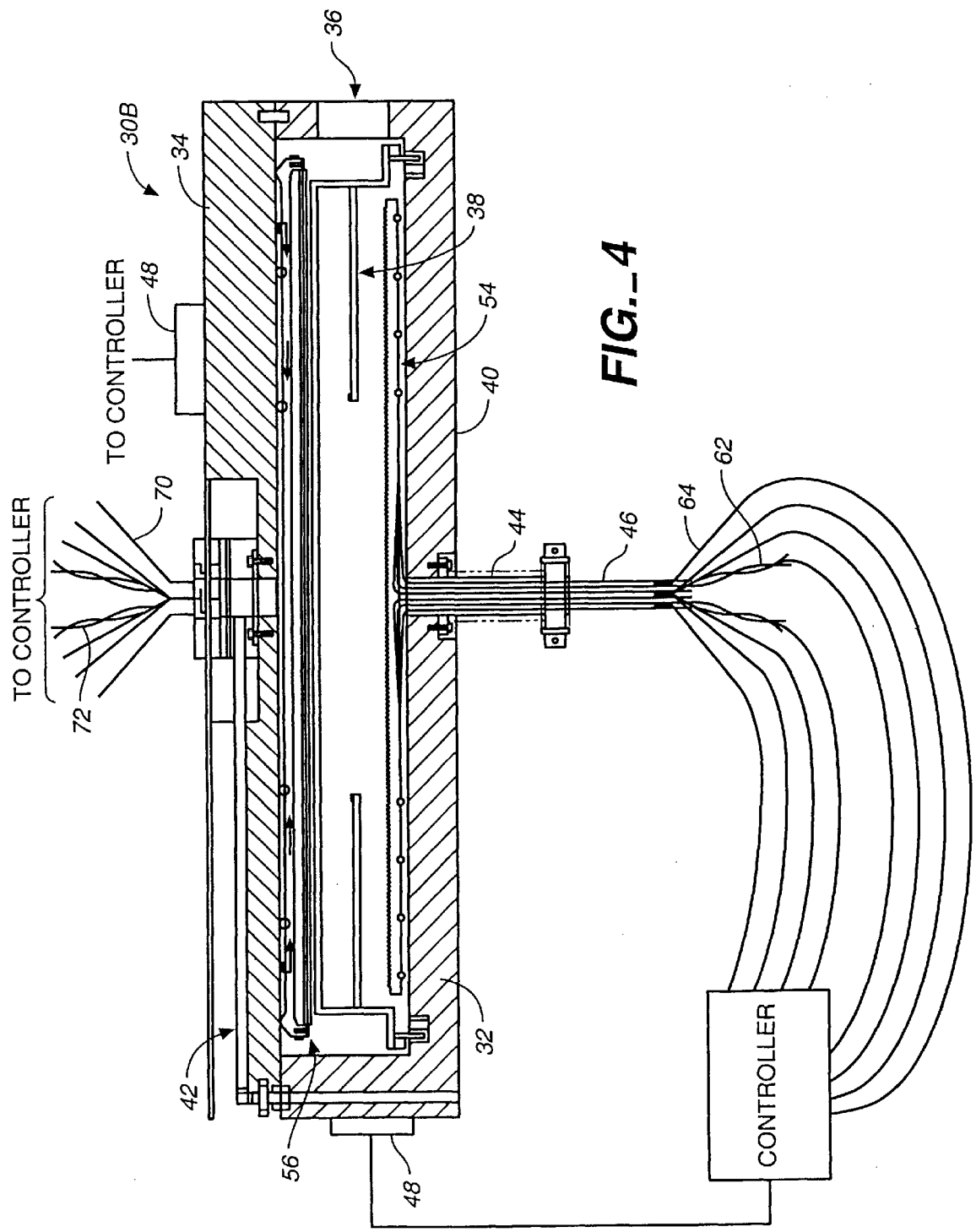
FIG._4

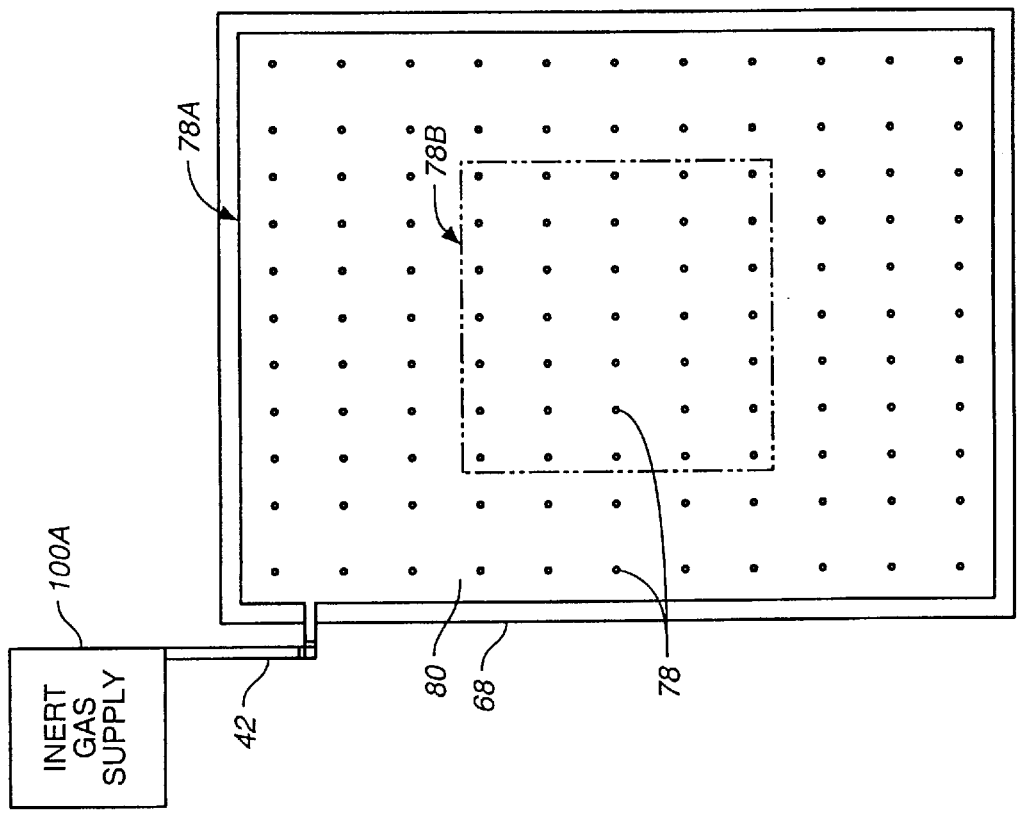
FIG._7
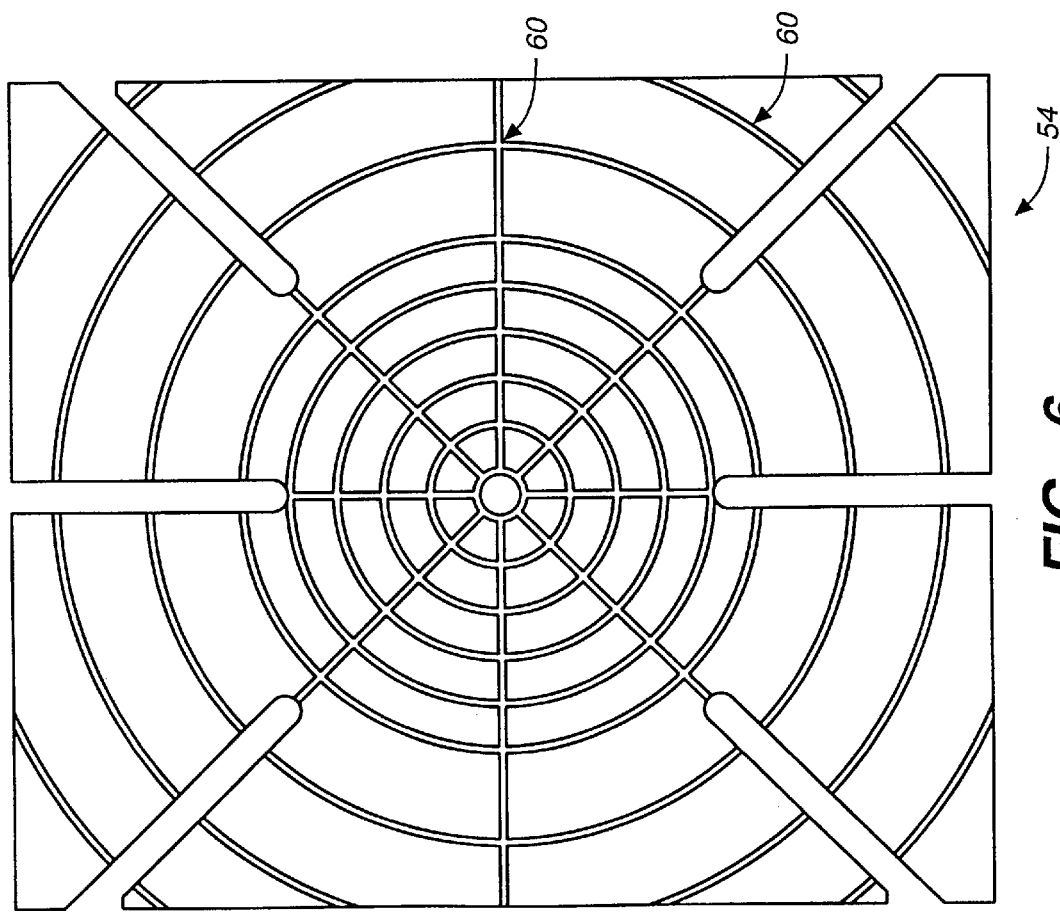
FIG._6

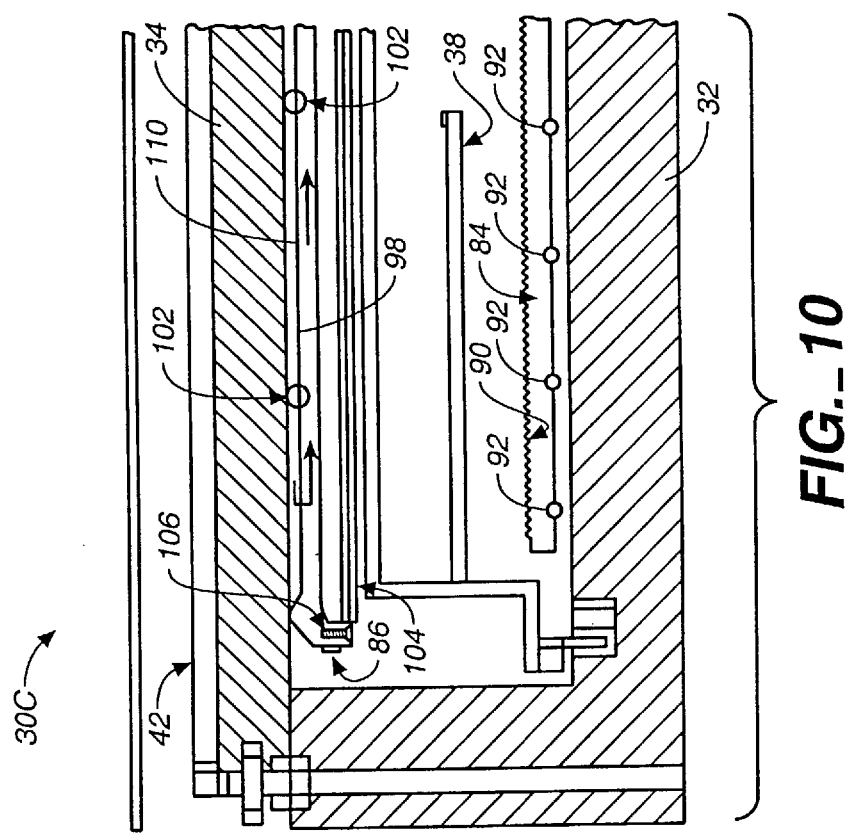
FIG._10
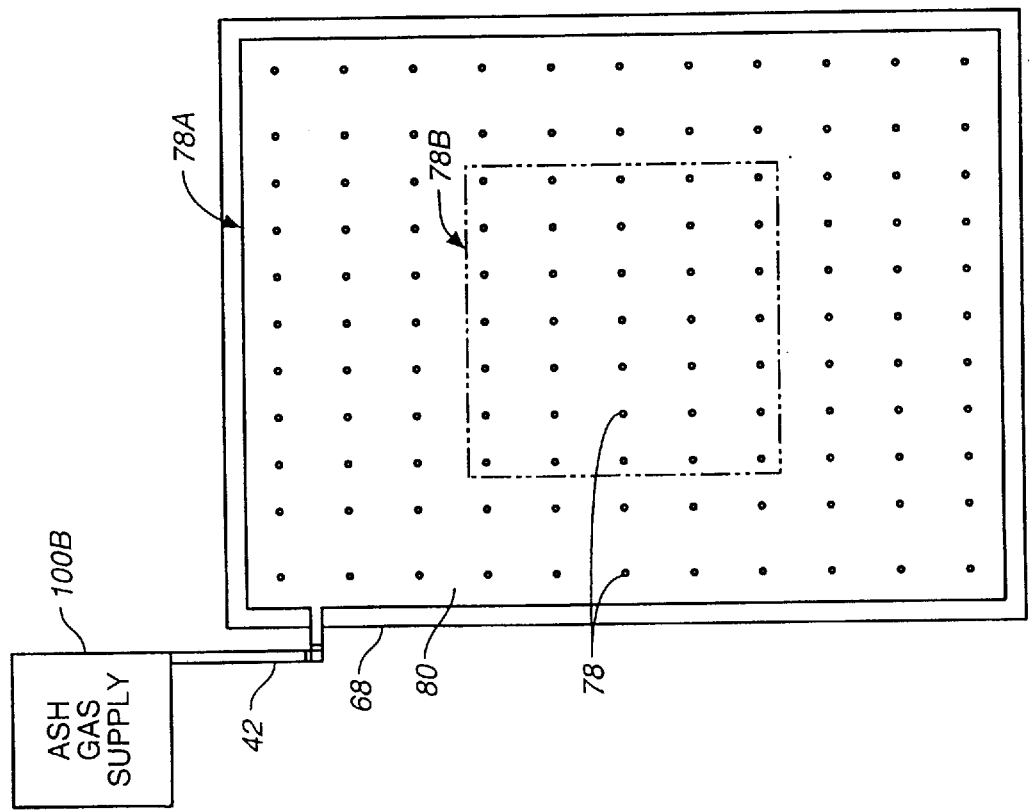
FIG._8

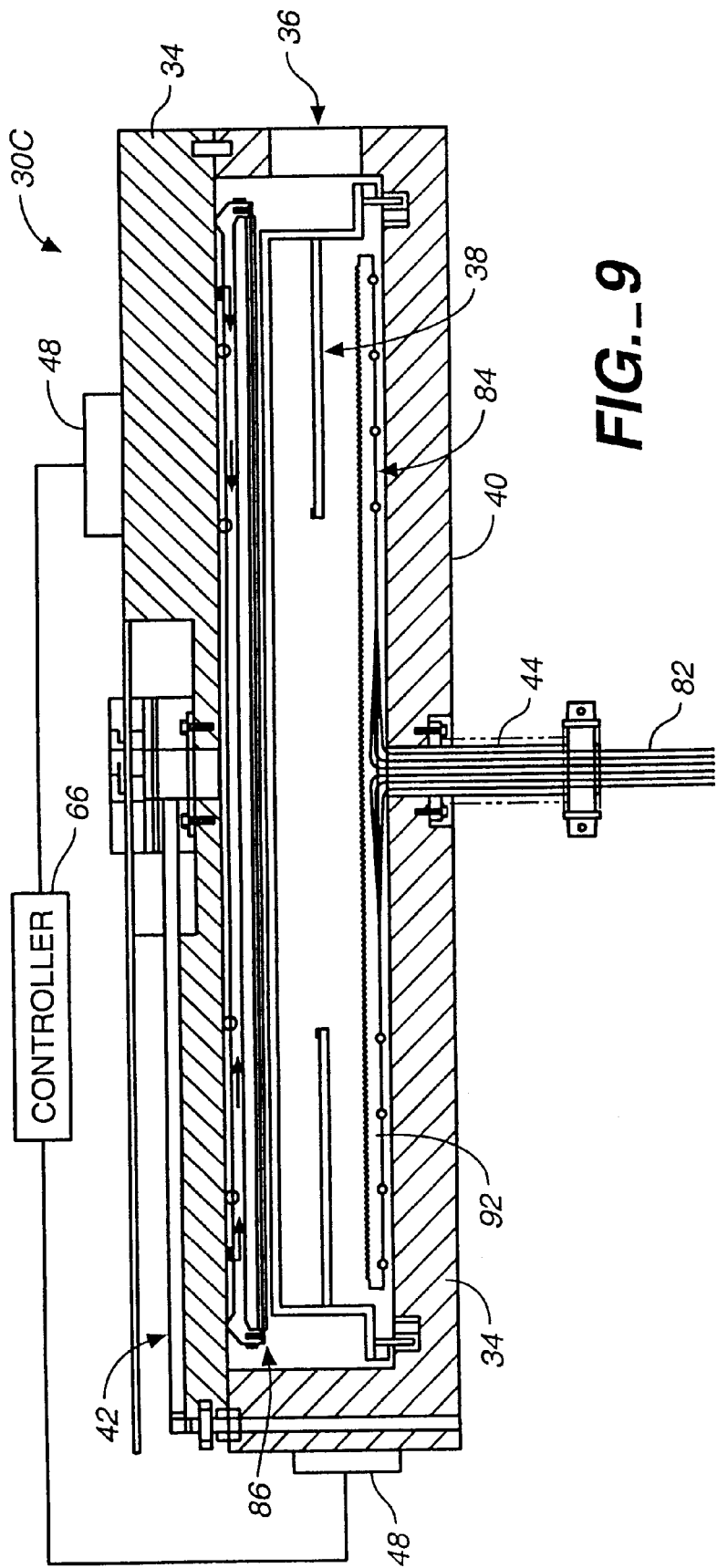
FIG._9

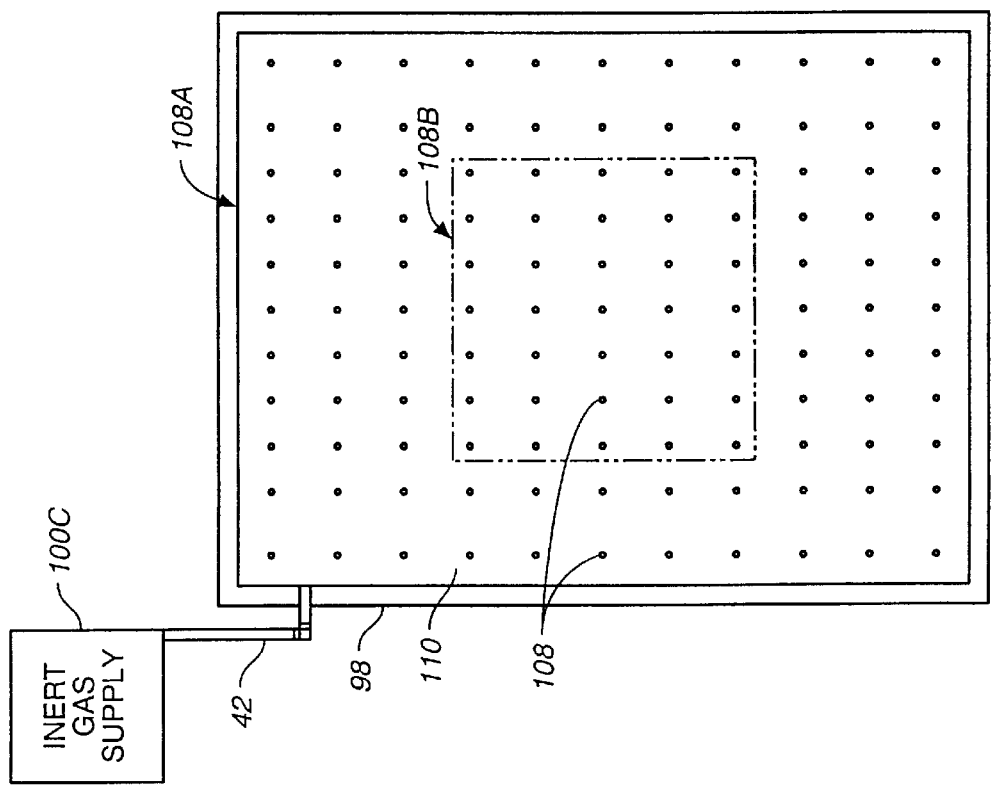
FIG._12
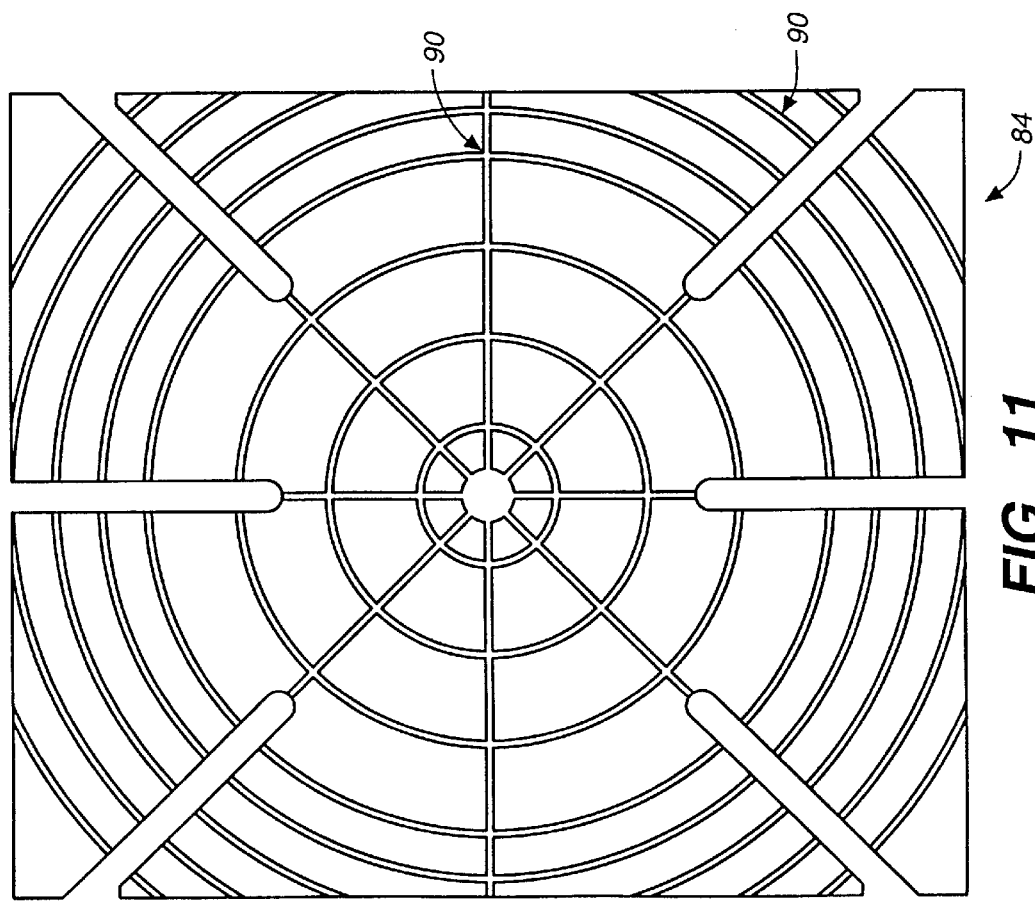
FIG._11

MULTI-FUNCTION CHAMBER FOR A SUBSTRATE PROCESSING SYSTEM

RELATED APPLICATIONS

"This is a divisional of copending application (s) Ser. No. 09/082,375 filed on May 20, 1998."

The present application is related to co-pending U.S. patent application Ser. No. 08/946,922, filed Oct. 8, 1997 and entitled "Modular On-Line Processing System," as well as the following U.S. patent applications which are being filed concurrently with this application: (1) "Method and Apparatus for Substrate Transfer and Processing"(2) "Isolation Valves,"; (3) "An Automated Substrate Processing System,"; (4) "Substrate Transfer Shuttle Having a Magnetic Drive,"; (5) "Substrate Transfer Shuttle,"; (6) "In-Situ Substrate Transfer Shuttle,"; and (7) "Modular Substrate Processing System,".

The foregoing patent applications, which are assigned to the assignee of the present application, are incorporated herein by reference in their entirety.

BACKGROUND

The present invention relates generally to substrate processing systems, and, in particular, to a multi-function chamber for a substrate processing system.

Glass substrates are being used for applications such as active matrix television and computer displays, among others. Each glass substrate can form multiple display monitors each of which contains more than a million thin film transistors.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

The glass substrates can have dimensions, for example, of 550 mm by 650 mm. The trend is toward even larger substrate sizes, such as 650 mm by 830 mm and larger, to allow more displays to be formed on the substrate or to allow larger displays to be produced. The larger sizes place even greater demands on the capabilities of the processing systems.

Some of the basic processing techniques for depositing thin films on the large glass substrates are generally similar to those used, for example, in the processing of semiconductor wafers. Despite some of the similarities, however, a number of difficulties have been encountered in the processing of large glass substrates that cannot be overcome in a practical way and cost effectively by using techniques currently employed for semiconductor wafers and smaller glass substrates.

For example, efficient production line processing requires rapid movement of the glass substrates from one work station to another, and between vacuum environments and atmospheric environments. The large-size and shape of the glass substrates makes it difficult to transfer them from one position in the processing system to another. As a result, cluster tools suitable for vacuum processing of semiconductor wafers and smaller glass substrates, such as substrates up to 550 mm by 650 mm, are not well suited for the similar processing of larger glass substrates, such as 650 mm by 830 mm and above. Moreover, cluster tools require a relatively large floor space.

Similarly, chamber configurations designed for the processing of relatively small semiconductor wafers are not particularly suited for the processing of these larger glass substrates. The chambers must include apertures of sufficient size to permit the large substrates to enter or exit the chamber. Moreover, processing substrates in the process chambers typically must be performed in a vacuum or under low pressure. Movement of glass substrates between processing chambers, thus, requires the use of valve mechanisms which are capable of closing the especially wide apertures to provide vacuum-tight seals and which also must minimize contamination.

Furthermore, relatively few defects can cause an entire monitor formed on the substrate to be rejected. Therefore, reducing the occurrence of defects in the glass substrate when it is transferred from one position to another is critical. Similarly, misalignment of the substrate as it is transferred and positioned within the processing system can cause the process uniformity to be compromised to the extent that one edge of the glass substrate is electrically non-functional once the glass has been formed into a display. If the misalignment is severe enough, it even may cause the substrate to strike structures and break inside the vacuum chamber.

Other problems associated with the processing of large glass substrates arise due to their unique thermal properties. For example, the relatively low thermal conductivity of glass makes it more difficult to heat or cool the substrate uniformly. In particular, thermal losses near the edges of any large-area, thin substrate tend to be greater than near the center of the substrate, resulting in a non-uniform temperature gradient across the substrate. The thermal properties of the glass substrate combined with its size, therefore, makes it more difficult to obtain uniform characteristics for the electronic components formed on different portions of-the surface of a processed substrate. Moreover, heating or cooling the substrates quickly and uniformly is more difficult as a consequence of its poor thermal conductivity, thereby reducing the ability of the system to achieve a high throughput.

Depending on the functions or processes to be performed within a particular process chamber, pre-processing or post-processing, such as heating or cooling of a substrate, may be required. Such pre-processing and post-processing functions may be performed in chambers separate from a primary process chamber. Due to the various functions that a particular chamber is designed to perform, each chamber may be configured differently from other chambers. Moreover, once a chamber is designed to perform a particular function, such as pre-process heating of the substrate, it may not be possible to reconfigure the chamber to perform another different function, such as post-process cooling of the substrate. Such designs can limit the flexibility offered by a given chamber.

SUMMARY

In general, according to one aspect, an evacuable chamber includes a chamber body having an aperture to allow a substrate to be transferred into or out of the chamber. The chamber is configurable using removable components in at least two of the following configurations: a base configuration for providing a transition between two different pressures, a heating configuration for heating the substrate and providing a transition between two different pressures, and a cooling configuration for cooling the substrate and providing a transition between two different pressures.

When the chamber is configured in the base configuration, the chamber includes at least one removable volume reducing element. The removable volume reducing elements can be made, for example, of plastic, aluminum or other vacuum-compatible material. One volume reducing element can be positioned adjacent and below a lid of the chamber. Another volume reducing element can be positioned adjacent and above the bottom interior surface of the chamber.

When configured in the heating configuration, the chamber includes an upper heating assembly and a heating platen. The upper heating assembly can be disposed between a lid of the chamber and a substrate support mechanism. The heating platen can be movable to lift a substrate positioned on the support mechanism to a heating position below the upper heating assembly, and to lower the substrate from the heating position onto the support mechanism.

The heating platen can include inner and outer heating loops whose temperatures are independently controllable. For example, during operation, the temperature of the outer loop can be maintained at a higher temperature than the inner loop. The heating platen also can have an upper surface having a pattern of horizontal channels designed to control a contact area between a substrate and the heating platen when the substrate is supported on the upper surface of the platen. For example, the concentration of channels can be greater near the center of the platen than near its perimeter.

The upper heating assembly can have a stationary plate with inner and outer heating loops whose temperatures can be controlled independently of one another. A gas delivery tube can be attached to the chamber, and the stationary plate can include a series of vertical holes to allow a gas to be delivered from the delivery tube to an interior region of the chamber via the vertical holes. The upper heating assembly also can have a diffusion screen disposed between the stationary plate and the substrate heating position.

Various of the foregoing features can help compensate for thermal losses near the edges of a large glass substrate and can provide a more uniform temperature across the substrate when the chamber is configured in the heating configuration.

The heating configuration also can be used to perform ashing processes.

When configured in the cooling configuration, the chamber can include a cooling platen and may also include an upper cooling assembly. When an upper cooling assembly is employed, it can be disposed between a lid of the chamber and a substrate support mechanism. The cooling platen can be movable to lift a substrate positioned on the support mechanism to a cooling position below the upper cooling assembly, and to lower the substrate from the cooling position onto the support mechanism.

The cooling platen can include multiple cooling tubes through which a cooling fluid can flow. In one implementation, the concentration of cooling tubes near the center of the platen can be greater than the concentration near the perimeter. The cooling platen can have an upper surface with a pattern of horizontal channels designed to control a contact area between a substrate and the cooling platen when the substrate is supported on the upper surface of the platen. In one implementation, the concentration of channels near the perimeter of the cooling platen is greater than near the center.

The upper cooling assembly also can have a stationary plate with multiple cooling tubes through which a cooling fluid can be provided to flow. In some implementations, the concentration of cooling channels is greater near the center of the stationary plate than near the perimeter. A gas delivery tube can be attached to the chamber. The stationary plate includes a series of vertical holes to allow a gas to be delivered from the delivery tube to an interior region of the chamber via the vertical holes. The upper cooling assembly further can include a diffusion screen disposed between the stationary plate and the substrate cooling position.

Various of the foregoing features can help compensate for, or take into account, thermal losses near the edges of a large glass substrate and can provide a more uniform temperature across the substrate when the chamber is configured in the cooling configuration.

Resistive elements can be provided to heat the chamber body and the lid to maintain them within a specified temperature range and to compensate for thermal losses near the substrate edges. The resistive elements can be used, for example, when the chamber is configured as a cooling chamber.

Water cooling can be provided to the chamber body and lid when the chamber is configured as a heating chamber if removal of excess heat is necessary to limit and control temperature.

In yet a further aspect, a load lock chamber includes a chamber body having an aperture to allow a substrate to be transferred into or out of the chamber; and a thermally conductive platen for supporting a substrate within the chamber. The platen has multiple zones for preferentially changing the temperature of the substrate by conduction so as to compensate for thermal losses near edges of the substrate.

In addition, a method of processing a substrate in a load lock chamber includes supporting the substrate on a substrate support mechanism within the chamber and changing the pressure in the chamber from a first pressure to a second pressure. The method further includes controlling various surface temperatures in the chamber to compensate for, or take into account, thermal losses near edges of the substrate.

Various implementations include one or more of the following advantages. A single load lock chamber can be configured in multiple configurations depending on the requirements of the particular substrate process system. The chamber design, therefore, facilitates changes in system design because the chamber can be re-configured relatively easily and quickly. Furthermore, the various configurations of the chamber allow transitions between first and second pressures, such as atmospheric and process pressures, to be performed quickly.

Various features also enable a large glass substrate to be cooled or heated quickly, thereby increasing the throughput of the system. Depending on the particular configuration used, various features of the chamber design help compensate for thermal losses near the substrate edges to provide a more uniform temperature across substrate. Various features also can help maintain the edges of a substrate in compression which can reduce the likelihood of substrate breakage during heating, cooling and other processes.

Additionally, the disclosed techniques for distributing a gas throughout the chamber provide improvements over prior techniques, which were not well suited for handling large substrates.

Other features and advantages will be apparent from the following detailed description, drawings and claims.

BRIEF DESCRIPTION OF THE DRAWINGS

FIG. 1 is a top plan schematic view of a substrate processing system.

FIG. 2 is a cross-sectional view of a load lock chamber according to the invention.

FIG. 3 is a cross-sectional view of the chamber of FIG. 2 configured as a base load lock chamber.

FIG. 4 is a cross-sectional view of the chamber of FIG. 2 configured as a heating or ashing load lock chamber.

FIG. 5 is an enlarged partial view of the chamber of FIG. 4.

FIG. 6 is a top view of a lower heating platen according to one implementation of the invention.

FIG. 7 is a top view of an upper heating assembly and chamber according to one implementation of the invention.

FIG. 8 is a top view of an upper heating assembly and chamber according to another implementation of the invention.

FIG. 9 is a cross-sectional view of the chamber of FIG. 2 configured as a cooling load lock chamber.

FIG. 10 is an enlarged partial view of the chamber of FIG. 9.

FIG. 11 is a top view of a lower cooling platen according to one implementation of the invention.

FIG. 12 is a top view of an upper cooling assembly according to one implementation of the invention.

DETAILED DESCRIPTION

As shown in FIG. 1, a glass substrate processing system may include one or more islands 2. Each island 2 includes a first or input load lock chamber 4, one or more process chambers 6, and a second or output load lock chamber 8. In various implementations, the process chamber 6 can be, for example, a chemical vapor deposition (CVD) chamber, a physical vapor deposition (PVD) chamber, or an etch chamber.

Glass substrates, which can be on the order of one square meter, are transferred, for example, by a continuous conveyor 10, to and from the island 2 where one or more process steps can be performed sequentially to the substrate. An atmospheric loading robot 12 with an end effector 14 can deliver substrates from the conveyor 10 to the input load lock chamber 4. Similarly, an atmospheric unloading robot 16 with an end effector 18 can deliver substrates from the output load lock chamber 8 to the conveyor 10. As illustrated in FIG. 1, a fresh substrate 20A is loaded into the load lock chamber 4 by the loading end effector 14, and a processed substrate 20B is removed from the load lock chamber 8 by the unloading end effector 18. A substrate transfer mechanism (not shown in FIG. 1) can transfer the substrates 20A, 20B between the various chambers 4, 6 and 8 through apertures such as transfer or slit valves 5, 7.

In general, substrate processing performed in the process chamber 6 typically must be done under low pressure, or in a vacuum such as approximately $10^{-8}$ Torr. Thus, the load lock chambers 4, 8 perform a transition between atmospheric pressure and the pressure in the process chamber 6. For example, the load lock chamber 4 can be pumped down to a low pressure, such as approximately $10^{-3}$ Torr, prior to transferring the substrate to the process chamber 6. Similarly, after the substrate is transferred from the process chamber 6 to the load lock chamber 8, the load lock chamber 8 can be brought to atmospheric pressure prior to opening the load lock chamber and transferring the substrate to the conveyor 10.

Referring to FIG. 2, an evacuable chamber 30, such as a load lock chamber, includes a temperature controlled chamber body 32 and a temperature controlled lid 34 attached to the chamber body. The chamber body 32 and lid 34 can be formed, for example, of aluminum, and can be heated by coupling resistive elements 48 to the outer surfaces of the chamber body and lid. The temperature of the resistive elements 48 can be controlled by a computer or other controller 66. An aperture 36 in one of the sidewalls of the chamber body 32 serves as a passageway for transferring a substrate into or out of the load lock chamber 30. The aperture 36 can be used, for example, when a substrate is transferred from the end effector 14 prior to processing or to the end effector 18 after processing. A separate opening (not shown) in another one of the chamber sidewalls can be used to transfer the substrate between the load lock chamber 30 and a process chamber, such as the process chamber 6 (FIG. 1).

A substrate transfer and support mechanism 38 is disposed within the load lock chamber 30. The transfer and support mechanism 38 is used to transfer a substrate into and out of the load lock and can support the substrate within the chamber interior. In one implementation, the substrate transfer mechanism is a transfer shuttle, such as the shuttle described in the U.S. patent application referred to above, entitled "Method and Apparatus for Substrate Transfer and Processing." During the transition from atmospheric pressure to vacuum or some other processing pressure, the transfer mechanism 38 is cleaned of particles as the flow of gas in the load lock chamber 30 is directed past the transfer mechanism prior to leaving the chamber through a vacuum port (not shown) in the bottom 40 of the chamber.

The chamber 30 also includes a gas delivery pipe or tube 42 through which a gas can be delivered to the interior of the chamber 30. Additionally, the chamber 30 includes an aperture 44 extending through the bottom 40 of the chamber 30. As described below, thermocouples, heating elements and/or a water line can be provided to the interior of the chamber through the aperture 44. In some implementations, the aperture 44 is closed or sealed.

As described in greater detail below, the load lock chamber 30 can be configured in at least the following configurations: a base configuration for providing a transition between two different pressures, a heating configuration for heating the substrate and providing a transition between two different pressures, or a cooling configuration for cooling the substrate and providing a transition between two different pressures. The load lock chamber 30 also can be configured in an ashing configuration. In general, the chamber 30 can be configured in at least two of the foregoing configurations. Furthermore, the load lock chamber 30 can be re-configured relatively easily from one configuration to another configuration.

The chamber 30 can be configured as a base load lock chamber 30A (FIG. 3) which can be used, for example, for transitions between first and second pressures, such as atmospheric pressure and a processing pressure. In the base configuration, one or more removable volume reducing elements 50A, 50B are added to the interior of the chamber 30A. In the illustrated implementation, an upper volume reducing element 50A is disposed adjacent and below the lid 34 and a lower volume reducing element 50B is disposed adjacent and above a bottom interior surface of the chamber. The mechanism 38 which supports the substrate is positioned between the upper and lower volume reducing elements 50A, 50B. In one implementation, the volume reducing elements 50A, 50B can be rectangular-shaped and can be formed, for example, of a plastic material such as LEXAN or aluminum. In general, the volume reducing elements 50A, 50B are designed to be as large as possible without interfering with the operation of the transfer mechanism 38 or the end effectors 14, 18 of the robots 12, 16 (FIG. 1) when the substrate is transferred from one position to another. The upper volume reducing element 50A can be attached to the chamber lid 34, for example, with screws, bolts or pins. The lower volume reducing element 50B can rest on the chamber floor.

One advantage of using the volume reducing elements 50A, 50B is that when the chamber 30A is used as an input load lock chamber, the pressure in the chamber can be pumped down to the processing pressure more quickly, thereby increasing the throughput of the system. Similarly, when the chamber 30A is used as an output-load lock chamber, the pressure in the chamber can be brought back to atmospheric pressure more quickly. Furthermore, when the chamber 30A is used as an output load lock chamber, an inert gas such as nitrogen or argon, is provided to the chamber interior, via the gas delivery tube 42, to provide the transition to atmospheric pressure. For this purpose, the upper volume reducing element 50A can include one or more vertical channels 52 that allow the gas to be provided to an interior region of the chamber. The upper surface of the volume reducing element 50A also can include horizontal channels (not shown) that allow the gas to flow from the delivery tube 42 to the vertical channels 52.

In some etch systems, substrates are maintained at temperatures of less than approximately 100° C. The base configuration is suitable, for example, as either the input or output load lock chamber in such etch systems.

The chamber 30 (FIG. 2) can also be configured as a heating load lock chamber 30B (FIGS. 4–7). In the heating configuration, the volume reducing elements 50A, 50B are removed, and are replaced by a removable upper heating assembly 56 and a removable lower heating platen 54, respectively. The upper heating assembly 56, which is described in greater detail below, can be attached to the chamber lid 34, for example, by shoulder screws, clamps, or bolts.

The lower heating platen 54 is a vertically movable temperature controlled hot plate, which can be formed, for example, from stainless steel. When a substrate is placed on the lower platen 54, the lower platen conducts heat directly into the substrate. The lower platen 54 includes an inner heating loop 58A and an outer heating loop 58B, each of which has one or more heating elements, such as coils. The heating elements for the inner and outer loops 58A, 58B can be coupled to the controller 66 by connections 62 through a tube 46 which extend through the aperture 44 and which is welded to the lower platen 54. Thermocouples for measuring the temperature of the lower platen 54 also can be connected from the platen 54 to the controller 66 by connections 64 through the tube 46. The tube 46 can be surrounded by a bellows (not shown) to provide a vacuum seal within the chamber when the platen 54 moves vertically.

The temperature of the inner and outer heating loops 58A, 58B can be controlled independently. The independent temperature control allows the surface of the platen 54 near its perimeter to be maintained at a different temperature from the surface of the platen near its center. In one implementation, the temperature of the outer loop 58B is maintained at a higher temperature than the inner loop 58A. Such a temperature difference helps compensate for the heat loss in the substrate near its edges and helps reduce the possibility of substrate breakage due to cracks propagating through the substrate as a result of edge defects. Rapid heating of substrates is, therefore, facilitated.

The upper surface of the lower platen 54 includes a pattern of one or more horizontal grooves or channels 60 (FIGS. 5–6). In one implementation, two sets of channels 60 are formed across the surface of the lower platen 54 with one set of channels formed radially and the other set formed circularly. In the illustrated implementation, the channels 60 have a width of about 6 mm and a depth of about 1 mm. Other dimensions may be suitable for particular applications. The spacing between adjacent channels, or the concentration of the channels, is designed to control the contact area between a substrate and the platen 54 and provides further control of the temperature gradient across the substrate. For example, in one implementation, fewer channels 60 per unit area are provided near the perimeter of the platen 54 compared to the number of channels near the center of the platen. Such a pattern increases the contact area between the platen and a surface of the substrate near the substrate edges compared to the contact area between the platen and a surface of the substrate near the substrate center. Therefore, the pattern of channels 60 also can help compensate for thermal losses near the edges of the substrate to provide a more uniform temperature profile across the substrate.

In operation, according to one implementation, an external robot, such as the robot 12 (FIG. 1), loads a substrate into the heating load lock chamber 30B and places the substrate onto the transfer mechanism 38. The lower heating platen 54 is raised and lifts the substrate off the transfer mechanism 38. The platen 54 continues rising until the substrate is brought to a heating position. The heating position should be as close as possible to the position in which the thermal losses from the edges of the substrate to the cooler walls of the chamber body 32 are minimized. In one implementation, for example, the substrate can be lifted to within several millimeters of the upper heating assembly 56 so that the viewing angle of the substrate edge with respect to the chamber walls is reduced as much as possible. As the chamber is heated, cooling water tubes with an appropriate degree of thermal contact to the outer walls of the chamber help maintain the temperature of the chamber walls within a desired range and prevent the walls from becoming too hot. The cooling tubes may be joined to a plate which is affixed to the chamber walls. For example, in one implementation, the temperature of the chamber walls is maintained at approximately 100° C. In addition, thermal barriers can be provided along the outside walls of the chamber to protect workers or others from touching the hot chamber surfaces.

As the lower platen 54 lifts the substrate off from the transfer mechanism 38 and raises it to the heating position, some of the channels 60 on the upper surface of the platen and holes through the platen allow gas that is between the platen and the substrate to escape. The channels 60 and holes thus help prevent the formation of a trapped cushion of gas that could cause the substrate to float and drift from its initial desired position on the platen 54.

The upper heating assembly 56 includes a stationary plate 68, which can be made of stainless steel and which includes an inner heating loop 69A and an outer heating loop 69B, each of which has one or more heating elements, such as coils. The temperature of the loops 69A, 69B can be controlled so as to obtain a more uniform temperature across the substrate. Thermocouples can be attached to the plate 68 for measuring its temperature. The thermocouples and heating elements can be coupled to the controller 66 by connections 70 and 72, respectively.

The stationary plate 68 further includes a series of vertical holes 78 (FIG. 7) which are formed through the plate 68. In the illustrated implementation, an outer zone 78A of holes 78 and an inner zone 78B of holes are formed through the plate 68. The heating assembly 56 also includes a diffusion screen 74 (FIG. 5) which can comprise one or more fine mesh screens or filters with multiple holes. The diffusion screen 74 is mounted to the stationary plate 68, for example, by a clamp 76.

Once a substrate is moved to its heating position in the chamber 30B, the upper heating assembly 56 heats the substrate primarily by conduction and radiation. Using an upper heater assembly which has zones of various emissivities on the surface facing the substrate can be used to facilitate the substrate heating rate, and thermal uniformity can be controlled. An inert gas, such as nitrogen or argon, can be introduced from a gas source 100A via the delivery tube 42 to the back-side or upper surface 80 of the plate 68 to facilitate the heating process further. The gas flows along the upper surface 80 of the plate 68 toward the holes 78. The gas, which is heated as it flows along the upper surface 80, then can pass through the holes 78 to the front-side or lower surface of the plate 68. The amount of gas flow exiting from the inner and outer zones 78A, 78B relative to one another into the chamber can be changed by varying the size or the number of holes 78 in the stationary plate 68, as well as by varying the gas pressure in the zones.

Once the gas flows to the front-side of the plate 68, the diffusion screen 74 directs the gas onto the substrate surface facing the heating assembly 56. The diffusion screen 74 can restrict the flow of the gas to limit disturbances that otherwise may be caused as the gas flows onto the substrate. The diffusion screen 74 also can bias the heat transfer to the substrate to improve the uniformity of the substrate temperature. For example, the diffusion screen 74 preferentially can introduce more (or less) gas near the outer portions of the chamber to provide a more uniform temperature across the substrate. If a diffusion screen is not used, the gas flows directly on to the substrate.

The configuration of FIGS. 4–7 can be used, for example, as an input load lock chamber in which a substrate is heated prior to being transferred to a process chamber. Such preprocess heating may be required or desirable, for example, in CVD and PVD systems, as well as other substrate processing systems. When the load lock chamber 30B is used as an input chamber to heat the substrate prior to its transfer to a process chamber, the amount and extent of gas flow from the delivery tube 42 may need to be regulated or limited to allow the chamber 30B to be pumped down to a vacuum or some other process pressure.

Once the desired heating of the substrate occurs, the platen 54 is lowered, allowing the substrate to be transferred back to the transfer mechanism 38. The substrate then can be transferred by the transfer mechanism 38, for example, to the process chamber 6.

The chamber 30B also can be used as an ash load lock chamber. In such an application, the inert gas source 100 is replaced by an ash gas source 100D (FIG. 8). Such a configuration can be used, for example, as an output load lock chamber where, in addition to providing a transition to atmospheric pressure, a post-process ash takes place. In one implementation, the chamber 30B can be used as an ash load lock to ash a photoresist layer on a substrate that is received from a primary process chamber, such as the chamber 6 (FIG. 1).

When the chamber 30B is configured as an ash load lock chamber, the chamber is typically heated to a lower temperature than when the chamber is used as an input heating load lock. In one exemplary application, the controller 66 heats the chamber 30B to approximately 150° C., and an ash gas, such as oxygen ($O_2$) or carbon tetra fluoride ($CF_4$), is provided to the chamber interior via the delivery tube 42. Once the ashing process is completed, the load lock is pumped, purged and vented to atmospheric pressure. The substrate then can be transferred, for example, by the robot 16 to the conveyor 10.

The chamber 30 (FIG. 2) also can be configured as a cooling load lock chamber 30C (FIGS. 9–12). The cooling configuration 30C includes a removable upper cooling assembly 86 and a removable lower cooling platen 84. The upper cooling assembly 86, which is described in greater detail below, can be attached to the chamber lid 34, for example, by shoulder screws, clamps or bolts.

The lower cooling platen 84 is a vertically movable temperature controlled cooling plate, which can be formed, for example, from stainless steel or aluminum. When a substrate is placed on the lower platen 84, the lower platen conducts heat directly from the substrate, thereby cooling the substrate. When temperatures of the chamber walls and arriving substrates are sufficiently low, the lower platen may have sufficient heat loss to the chamber to allow continuous operation without the need to be actively cooled, for example, by running water through it. When necessary, however, the lower platen 84 includes multiple cooling tubes 92 through which a cooling fluid, such as water, can flow. The water can be provided to the cooling tubes 92 through a stainless steel water line 82 which extends through the aperture 44 and which is welded to the lower platen 84. The controller 66 can control the flow of water through the water line 82 to the tubes 92. The water line 82 can be surrounded by a bellows (not shown) to maintain the pressure within the chamber when the platen 84 moves vertically as described below. The position and concentration of the cooling tubes 92 is selected to obtain a more uniform temperature profile across the substrate by taking into account or compensating for thermal losses near the edges of the substrate. Thus, for example, the concentration of cooling tubes 92 near the center of the platen 84 can be greater than the concentration near its perimeter. Such a configuration can provide a more uniform temperature profile throughout the substrate, can help reduce the likelihood of substrate breakage, and can facilitate the rapid cooling of the substrate in the load lock chamber 30C.

The upper surface of the lower platen 84 includes a pattern of one or more horizontal grooves or channels 90 (FIGS. 10–11). In one implementation, two sets of channels 90 are formed across the surface of the lower platen 84 with one set of channels formed substantially perpendicular to the other set. In the illustrated implementation, the channels 90 have a width of about 6 mm and a depth of about 1 mm. Other dimensions may be suitable for particular applications. The spacing between the channels 90, or the concentration of the channels, is designed to control the contact area between a substrate and the platen 84 and provides further control of the temperature gradient across the substrate. For example, in one implementation, more channels 90 per unit area are provided near the perimeter of the platen 84 compared to the number of channels per unit area near the center of the platen. Such a pattern increases the contact area between the platen 84 and a first surface of the substrate near its center compared to the contact area between the platen and a second surface of the substrate near its perimeter where the first and second areas are the same size. In general, the pattern of channels 90 on the platen 84 can be designed to take into account or compensate for thermal losses near the edges of the substrate so as to provide a more uniform temperature profile throughout the substrate.

In operation, according to one implementation, a substrate is loaded from a process chamber, such as the chamber 6 (FIG. 1), onto the transfer mechanism 38 in the cooling load lock chamber 30C. The lower cooling platen 84 is raised and lifts the substrate off the transfer mechanism 38. The platen 84 continues rising until the substrate is brought to a cooling position. The substrate can be lifted, for example, to within several millimeters of the upper cooling assembly 86 so that the viewing angle of the substrate edge with respect to the chamber walls is reduced as much as possible when the substrate is in its cooling position.

The upper cooling assembly 86 includes a stationary plate 98, which can be made of stainless steel or aluminum and which includes multiple cooling tubes 102 through which a cooling fluid, such as water, can flow. The configuration of the cooling tubes 102 also is designed to provide a more uniform temperature throughout the substrate by taking into account or compensating for thermal losses near the edges of the substrate. In one implementation, the concentration of the cooling channels is greater near the center of the plate 98 than near its perimeter.

The stationary plate 98 further includes a series of vertical holes 108 (FIG. 12) which are formed through the plate 98. In the illustrated implementation, an outer zone 108A of holes 108 and an inner zone 108B of holes 108 are formed through the plate 98. The upper cooling assembly 86 also includes a diffusion screen 104 (FIG. 10) which can comprise one or more fine mesh screens or filters having multiple holes. In some implementations, the diffusion screen 104 preferentially can introduce more (or less) gas near the center of the chamber relative to other parts of the chamber. The diffusion screen 104 is mounted to the stationary plate 98, for example, by a clamp 106.

Once a substrate is moved to its cooling position in the chamber 30C, the upper cooling assembly 86 helps cool the substrate primarily by forced convection and radiation processes. Zones of various emissivities on the surface of the upper cooling assembly facing the substrate also can be used to facilitate the cooling process and tailor thermal uniformity. An inert gas, such as nitrogen or argon, can be introduced from a gas source 100C via the delivery tube 42 to the back-side or upper surface 110 of the plate 98 to facilitate the cooling process further. The gas flows along the upper surface 110 of the plate 98 toward the holes 108. The gas, which is cooled as it flows along the upper surface 110, then can pass through the holes 108 to the front-side or lower surface of the plate 98. The amount of gas flow exiting from the inner and outer zones 108A, 108B relative to one another into the chamber can be changed by varying the size or the number of holes 108 in the stationary plate 98, as well as by varying the gas pressure in the zones. Water-cooling the stationary plate may not always be required. When it is not, the stationary plate acts to distribute the gas flow to the back or upper side of the diffusion screen 104.

The diffusion screen 104 directs the gas onto the substrate surface facing the upper cooling assembly 86. The diffusion screen 104 can restrict and distribute the flow of the gas to limit turbulence and eddy flows that otherwise may be present as the gas flows onto the substrate. The diffusion screen 104 also can control the flow of gas to help bias heat transfer from the substrate. The diffusion screen can be designed, for example, so that the flow of the gas results in a more uniform temperature profile across the substrate.

When configured as a cooling load lock chamber, the chamber body 32 and lid 34 also can be heated using the resistive elements 48 to maintain their temperature within a specified range above the cooling water temperature. In one implementation, the temperature of the chamber walls is maintained at approximately 100° C. Heating the walls of the chamber body 32 during a cooling process can provide several advantages. First, such heating can compensate for the thermal losses near the substrate edges, thereby providing a more uniform temperature profile across the substrate as it cools. Furthermore, such heating can help reduce adsorption of water vapor on the chamber walls while the chamber is open during substrate removal. Reducing the amount of water vapor can prevent the water vapor from combining with residual by-products from the process chamber 6, such as chlorine gas ($Cl_2$). Preventing the combination of water vapor and such residual by-products is important because the combination of such chemicals can cause corrosion of the chamber 30C. Additionally, when the cooling load lock is arranged adjacent a process chamber in which heating of the walls is desirable or necessary, the hot surfaces of the chamber body also prevent the cooling load lock from acting as a heat sink and drawing heat from the process chamber.

The configuration of FIGS. 9–12 can be used, for example, as an output load lock chamber in which a substrate is cooled and the chamber is returned to atmospheric pressure prior to being transferred to the conveyor 10 (FIG. 1). Such post-process cooling may be required or desirable, for example, in CVD or PVD systems where processing temperatures may reach 200–450° C. To accelerate the transition to atmospheric pressure, an inert gas such as nitrogen or argon can be provided to the chamber 30C from the delivery tube 42. The channels 90 in the upper surface of the lower cooling platen 84 and holes through the platen allow gas to reach the backside of the substrate which facilitates separating the substrate from the platen. The substrate then can be transferred to the transfer mechanism 38 and to the conveyor 10 (FIG. 1).

Although the control system is shown as a single controller 66, the control system can include multiple dedicated controllers to control such features as the movement of the lower platens 54, 84, as well as the temperature of the lower platens, the temperature of the upper assemblies 56, 86, the temperature of the chamber body 32 and chamber lid 34, the flow of a cooling fluid through the line 82, and the flow of gas through the gas tube 42.

As described above, a single load lock chamber 30 (FIG. 1) can be configured in multiple configurations depending on the requirements of the particular substrate process system. The chamber design, therefore, facilitates changes in system design because the chamber 30 can be re-configured relatively easily and quickly. Furthermore, the various configurations of the chamber 30 allow transitions between first and second pressures, such as atmospheric and process pressures, to be performed quickly.

Various features of the load lock chamber can provide a more uniform temperature across a substrate as it is heated or cooled. Although it is desirable to obtain a perfectly uniform temperature across the substrate, it is difficult, if not impossible, to achieve such perfect uniformity in practice. Accordingly, various features of the load lock are designed to ensure that portions of the substrate near its edges are maintained at a temperature at least as high as the temperatures in other portions of the substrate. Such features result in a slight compressive force to the edges of the substrate and help reduce the likelihood of substrate breakage in the chamber. The various configurations also enable a substrate to be cooled or heated quickly, thereby increasing the throughput of the system.

Other implementations are within the scope of the following claims.

What is claimed is:

1. An evacuable chamber, comprising:

a chamber body having an aperture to allow a substrate to be transferred into or out of the chamber;

wherein the chamber is configurable using removable components in at least two of the following configurations: a base configuration for providing a transition between two different pressures, a heating configuration for heating the substrate and providing a transition between two different pressures, and a cooling configuration for cooling the substrate and providing a transition between two different pressures; and wherein when configured in the base configuration, the chamber further includes at least one removable volume reducing element disposed therein, when configured in the heating configuration, the chamber further includes an upper heating assembly and a heating platen, and when configured in the cooling configuration, the chamber further includes an upper cooling assembly and a cooling platen.

2. The chamber of claim 1 wherein the chamber is configurable in the base configuration, the heating configuration and the cooling configuration.

3. The chamber of claim 1 wherein the chamber can be re-configured from a first one of the configurations to a second one of the configurations.

4. The chamber of claim 1, wherein when configured in the base configuration, the chamber further includes upper and lower volume reducing elements, wherein the substrate support mechanism is disposed between the upper and lower volume reducing elements.

5. The chamber of claim 4 wherein the chamber is configured in the base configuration as an input chamber to provide a transition from atmospheric pressure to a process pressure.

6. The chamber of claim 4 wherein the chamber is configured in the base configuration as an output load lock chamber to provide a transition from a process pressure to atmospheric pressure.

7. The chamber of claim 1 further comprising:

a substrate support mechanism disposed within the chamber; and a lid attached to the chamber body;

wherein, when in the heating configuration, the upper heating assembly is disposed between the lid and the substrate support mechanism; and the heating platen is movable to lift a substrate positioned on the support mechanism to a heating position below the upper heating assembly, and to lower the substrate from the heating position onto the support mechanism.

8. The chamber of claim 7 wherein the chamber is configured as an input load lock chamber in the heating configuration to provide a transition from atmospheric pressure to a process pressure.

9. The chamber of claim 7 wherein the chamber is configurable as an ashing chamber.

10. The chamber of claim 9 wherein the chamber is configured as an output load lock chamber in the ashing configuration to provide a transition from a process pressure to atmospheric pressure.

11. The chamber of claim 1 further comprising:

a substrate support mechanism disposed within the chamber; and a lid attached to the chamber body, wherein, when in the cooling configuration, the upper cooling assembly is disposed between the lid and the substrate support mechanism; and the cooling platen is movable to lift a substrate positioned on the support mechanism to a cooling position below the upper cooling assembly, and to lower the substrate from the cooling position onto the support mechanism.

12. The chamber of claim 11 wherein the chamber is configured as an output load lock chamber in the cooling configuration to provide a transition from a process pressure to atmospheric pressure.

* * * * *

UNITED STATES PATENT AND TRADEMARK OFFICE
CERTIFICATE OF CORRECTION

PATENT NO.   : 6,193,507 B1                                             Page 1 of 1
DATED        : February 27, 2001
INVENTOR(S)  : White et al.

It is certified that error appears in the above-identified patent and that said Letters Patent is hereby corrected as shown below:

<u>Column 9,</u>
Line 55, please replace "100D" with "100B".

Signed and Sealed this

Second Day of October, 2001

Attest:

*Nicholas P. Godici*

NICHOLAS P. GODICI
*Attesting Officer*   *Acting Director of the United States Patent and Trademark Office*